(12) United States Patent
Sass

(10) Patent No.: US 10,181,878 B2
(45) Date of Patent: Jan. 15, 2019

(54) DRIVER CIRCUIT FOR AN INDUCTOR COIL

(71) Applicant: Continental Automotive GmbH, Hannover (DE)

(72) Inventor: Dieter Sass, Regensburg (DE)

(73) Assignee: Continental Automotive GmbH, Hannover (DE)

( * ) Notice: Subject to any disclaimer, the term of this patent is extended or adjusted under 35 U.S.C. 154(b) by 0 days.

(21) Appl. No.: 15/518,188

(22) PCT Filed: Aug. 17, 2015

(86) PCT No.: PCT/EP2015/068819
§ 371 (c)(1),
(2) Date: Apr. 10, 2017

(87) PCT Pub. No.: WO2016/055201
PCT Pub. Date: Apr. 14, 2016

(65) Prior Publication Data
US 2017/0331525 A1    Nov. 16, 2017

(30) Foreign Application Priority Data

Oct. 8, 2014    (DE) .................. 10 2014 220 406

(51) Int. Cl.
| | |
|---|---|
| *H01P 1/15* | (2006.01) |
| *H04B 5/00* | (2006.01) |
| *B60L 11/18* | (2006.01) |
| *H03K 17/13* | (2006.01) |

(Continued)

(52) U.S. Cl.
CPC .............. *H04B 5/0093* (2013.01); *B60L 1/00* (2013.01); *B60L 11/182* (2013.01); *H03K 17/13* (2013.01);
(Continued)

(58) Field of Classification Search
CPC ....... B60R 25/04; B60R 25/20; B60R 25/209; B60R 25/241; H04B 1/0483; H04B 5/0025
(Continued)

(56) References Cited

U.S. PATENT DOCUMENTS

| | | | |
|---|---|---|---|
| 6,229,494 B1 | 5/2001 | Merenda | |
| 7,961,015 B2 * | 6/2011 | Elliott | .............. H04B 5/02 327/110 |

(Continued)

FOREIGN PATENT DOCUMENTS

| | | |
|---|---|---|
| DE | 19702841 A1 | 7/1998 |
| DE | 102006024467 A1 | 11/2007 |

(Continued)

OTHER PUBLICATIONS

International Search Report and Written Opinion dated Nov. 4, 2015 from corresponding International Patent Application No. PCT/EP2015/068819.

*Primary Examiner* — Dean Takaoka

(57) ABSTRACT

Driver circuit in which a capacitor (4), in a manner controlled by a switch control device (9) which is connected downstream of a current measuring device (8), is charged to a reference voltage (Ur) by means of a charging current (Ic2), and the charged capacitor is discharged in an oscillating manner via an inductor coil (1), wherein the discharging operation is terminated when the current (Ia) through the inductor coil has passed through an entire oscillation period or several oscillation periods, wherein a first controllable switch (5) is connected in series between a first non-reactive resistor (6) and the first capacitor (4) in one of two input paths. Furthermore, a second controllable switch (7) and a fourth controllable switch (14) are connected into two output paths, and a second non-reactive resistor (13) is connected between a second connection (X2) of the inductor coil (1)

(Continued)

and a connection for a reference potential (Um). The current measuring device (8) is connected between the fourth controllable switch (14) and the first capacitor (4).

13 Claims, 12 Drawing Sheets

(51) Int. Cl.
      *H03K 17/16*   (2006.01)
      *B60L 1/00*   (2006.01)
      *B60R 25/20*   (2013.01)

(52) U.S. Cl.
    CPC ......... *H03K 17/136* (2013.01); *H03K 17/162* (2013.01); *H04B 5/0037* (2013.01); *H04B 5/0031* (2013.01); *H04B 5/0075* (2013.01); *Y02T 10/7005* (2013.01); *Y02T 10/7072* (2013.01); *Y02T 90/122* (2013.01); *Y02T 90/14* (2013.01)

(58) Field of Classification Search
    USPC .......................... 307/10.1, 10.3; 340/426.36
    See application file for complete search history.

(56) References Cited

U.S. PATENT DOCUMENTS

| | | | | |
|---|---|---|---|---|
| 8,525,672 | B2* | 9/2013 | Moser | B60R 25/24 340/539.13 |
| 9,802,572 | B2* | 10/2017 | Froitzheim | H03K 17/133 |
| 9,912,359 | B2* | 3/2018 | Sass | H04B 1/0483 |
| 2008/0211635 | A1* | 9/2008 | Rauber | G06K 7/0008 340/10.3 |

FOREIGN PATENT DOCUMENTS

| | | |
|---|---|---|
| DE | 102009023855 A1 | 12/2010 |
| DE | 102013220596 A1 | 4/2015 |
| DE | 102014222603 B3 | 12/2015 |
| JP | H09321652 A | 12/1997 |
| JP | 2002168650 A | 6/2002 |
| JP | 2004074850 A | 3/2004 |
| JP | 2009135859 A | 6/2009 |
| WO | 2010/139376 A1 | 12/2010 |
| WO | 2013/164831 A1 | 11/2013 |

* cited by examiner

DRIVER CIRCUIT FOR AN INDUCTOR COIL

The invention relates to a driver circuit for an inductor coil, specifically an inductive antenna, and an active transmission device with a driver circuit.

Keyless vehicle access and start-up systems such as, for example, the Passive Start Entry (PASE) System, are automatic systems which permit the unlocking of a vehicle without the active use of a car key, and the start-up thereof by the simple actuation of the start button. This is made possible by an electronic chip key, which the driver carries with them. Periodically, by means of at least one antenna fitted to the vehicle, the vehicle transmits a request signal in a "LF" frequency range ("LF" stands for low frequency, with frequencies ranging, for example, from 20 kHz to 200 kHz) encoded using a first coding table. The system then goes into receiver mode in the "UHF" range ("UHF" stands for "Ultra High Frequency", with frequencies, for example, in the three-figure MHz range), and awaits confirmation. If a key equipped with a transponder is within range, the latter receives the LF signal, decodes it, and retransmits it as a UHF signal, newly-encoded by the application of a second coding table. The UHF signal is decoded in the vehicle. As both coding tables are known to the vehicle, its own original transmission can be compared with the signal just received and, in the event of the matching thereof, access is permitted. If no correct answer is received with a specific time interval, nothing happens, and the system switches back to standby mode. The engine start-up procedure essentially corresponds to the access procedure except that, in this case, the actuation of the engine start button is required.

As an antenna for the transmission of the LF signal, an inductive antenna is predominantly used which is configured, for example, as a ferrite core with a winding (also known as a magnetic antenna or ferrite antenna). In many cases, the inductor coil of the inductive antenna operates in combination with a capacitor in an oscillating circuit. The energy consumption of an oscillating circuit of this type is customarily restricted by a highest possible quality level and accurate frequency tuning in order to keep the total current consumption of the access and start-up systems as low as possible. Low current consumption, for example, is desirable in itself on the grounds that, if the vehicle is stationary for a prolonged period, the vehicle battery would otherwise be rapidly discharged. However, a high quality level restricts the data transmission rate, and accurate tuning with a high quality level involves an element of complexity. In consequence, conventional arrangements frequently represent an unsatisfactory compromise between the data transmission rate, complexity and energy consumption.

Quasi-resonant oscillating circuit drivers are thus known, by means of which a high quality level (and thus a low current consumption) and a sufficiently high data transmission rate can simultaneously be achieved. However, these driver circuits have a disadvantage, in that they are not compliant with radio licensing regulations. Radio licensing regulations are intended to ensure that other radio services, such as e.g. broadcast services (radio and television), mobile radio services (used by the police and security forces) or mobile telephony are not compromised in their operation. These quasi-resonant driver circuits have a further disadvantage, in that they are not compliant with automobile manufacturer regulations governing electromagnetic compatibility (EMC).

Quasi-resonant oscillating circuit drivers are also known, which are improved to the extent that they not only permit low current consumption and low interference signal emissions with limited circuit and calibration complexity, but also permit compliance with radio licensing regulations.

However, known quasi-resonant oscillating circuit drivers have a disadvantage in that the circuit complexity, and consequently costs, are high, specifically for the achievement of an oscillating circuit driver of surge-proof design.

The object of the invention is the disclosure of a driver circuit for an inductor coil which is improved in this regard. An improved active transmission device with an oscillating circuit is also disclosed.

This object is fulfilled by a driver circuit for an inductor coil as claimed in claim 1, and by an active transmission device as claimed in claim 13.

The driver circuit according to the invention for an inductor coil, specifically for an inductive antenna in a vehicle access and start-up system has a first capacitor, two input paths for the routing of a positive reference voltage for the first capacitor, and two output paths for the connection of the inductor coil to the first capacitor. The driver circuit moreover has a first controllable switch and an ohmic resistor, connected in series in one of the two input paths, wherein the first controllable switch is connected between the ohmic resistor and the first capacitor. The driver circuit also has a second controllable switch, which is connected in one of the two output paths, a fourth controllable switch, which is connected in the other of the two output paths, and an ohmic resistor which is connected between a second terminal of the inductor coil and a terminal for a reference potential. The driver circuit moreover comprises a current measuring device, which is connected between the fourth controllable switch and the first capacitor, and is designed for the measurement of a current flowing in the inductor coil. A switch control device is connected down-circuit of the current measuring device, which evaluates the current flowing in the inductor coil and is designed, firstly to close the first switch when the second and the fourth switches are open, in order to charge the first capacitor to the positive reference voltage, and thereafter to open the first switch and close the second and fourth switches, such that the first capacitor is discharged in an oscillating manner via the inductor coil, wherein the second and fourth switches are not opened again until the current flowing in the inductor coil has completed an entire oscillation period or a multiple thereof.

The advantages of the driver circuit according to the invention are reduced circuit and calibration complexity, reduced current consumption, and a reduced output of interference signals. Moreover, the driver circuit according to the invention permits compliance with radio licensing regulations.

The driver circuit can moreover comprise a second capacitor, which is connected between the fourth controllable switch and the current measuring device. In an arrangement of this type, voltages across the capacitors are never negative. This permits the employment of components which are produced using a cost-effective semiconductor technology (e.g. by bulk technology rather than SOI technology).

The driver circuit can moreover comprise a third input path for the routing of a negative reference voltage for the second capacitor, wherein a charging circuit is connected in the third input path. The charging circuit can comprise an ohmic resistor and a fifth controllable switch, which are mutually serially-connected in the third input path, wherein the fifth controllable switch is arranged between the ohmic resistor and the second capacitor. The first capacitor can thus be charged to a positive voltage, whereas the second switch is charged to a negative voltage. The reactive power emitted by the antenna can be increased accordingly.

The driver circuit can moreover comprise a limiting device, which is designed to limit a voltage across the first switch. Damage to the first switch can be prevented accordingly. To this end, the limiting device can comprise a Zener diode, and the voltage across the first switch can be a gate-source voltage.

The driver circuit can moreover comprise an ohmic resistor and a further controllable switch, which are connected in series between a control terminal on the first switch and the ohmic resistor. In this way a current through the limiting device can be limited. The driver circuit can moreover comprise a further ohmic resistor, which is connected between a control terminal and a source terminal of the further switch. The further switch will then be blocked, if no control signal is present on its control terminal.

The switch control device can incorporate a modulation input for a modulation signal, and can be designed for the control of switching cycles on the first switch, the second switch and the fourth switch in accordance with the modulation signal, in order to permit the advantageous achievement of multiple application options.

To this end, the switch control device can be designed for the execution of a phase-shift-keying-modulation, an amplitude-shift-keying-modulation or a frequency-shift-keying-modulation. For modulation, the switch control device delivers an effective quality factor of 1, whereas the oscillating circuit operates with a very high quality level, and consequently in a highly energy-saving manner.

The current measuring device can be configured as an ohmic resistor, whereby currents can be measured in a simple manner and with limited complexity.

The object is further fulfilled by an active transmission device with an inductor coil, a first capacitor, two input paths for the routing of a positive reference voltage for the first capacitor, and two output paths for the connection of the inductor coil to the first capacitor. A first controllable switch and an ohmic resistor are connected in series in one of the two input paths, wherein the first controllable switch is connected between the ohmic resistor and the first capacitor. A second controllable switch is connected in one of the two output paths, and a fourth controllable switch is connected in the other of the two output paths. An ohmic resistor is connected between a second terminal of the inductor coil and a terminal for a reference potential, and a current measuring device is connected between the fourth controllable switch and the first capacitor, and is designed for the measurement of a current flowing in the inductor coil. A switch control device is connected down-circuit of the current measuring device, which evaluates the current flowing in the inductor coil and is designed, firstly to close the first switch when the second and the fourth switches are open, in order to charge the first capacitor to the positive reference voltage, and thereafter to open the first switch and close the second and fourth switches, such that the first capacitor is discharged in an oscillating manner via the inductor coil, wherein the second and fourth switches are not opened again until the current flowing in the inductor coil has completed an entire oscillation period or a multiple thereof.

The driver circuit and transmission device are specifically components of a vehicle access and start-up system, which is also the object of the disclosure contained herein.

The invention is described in greater detail hereinafter with reference to the exemplary embodiments represented in the figures of the attached drawing. Herein:

Figure 1:
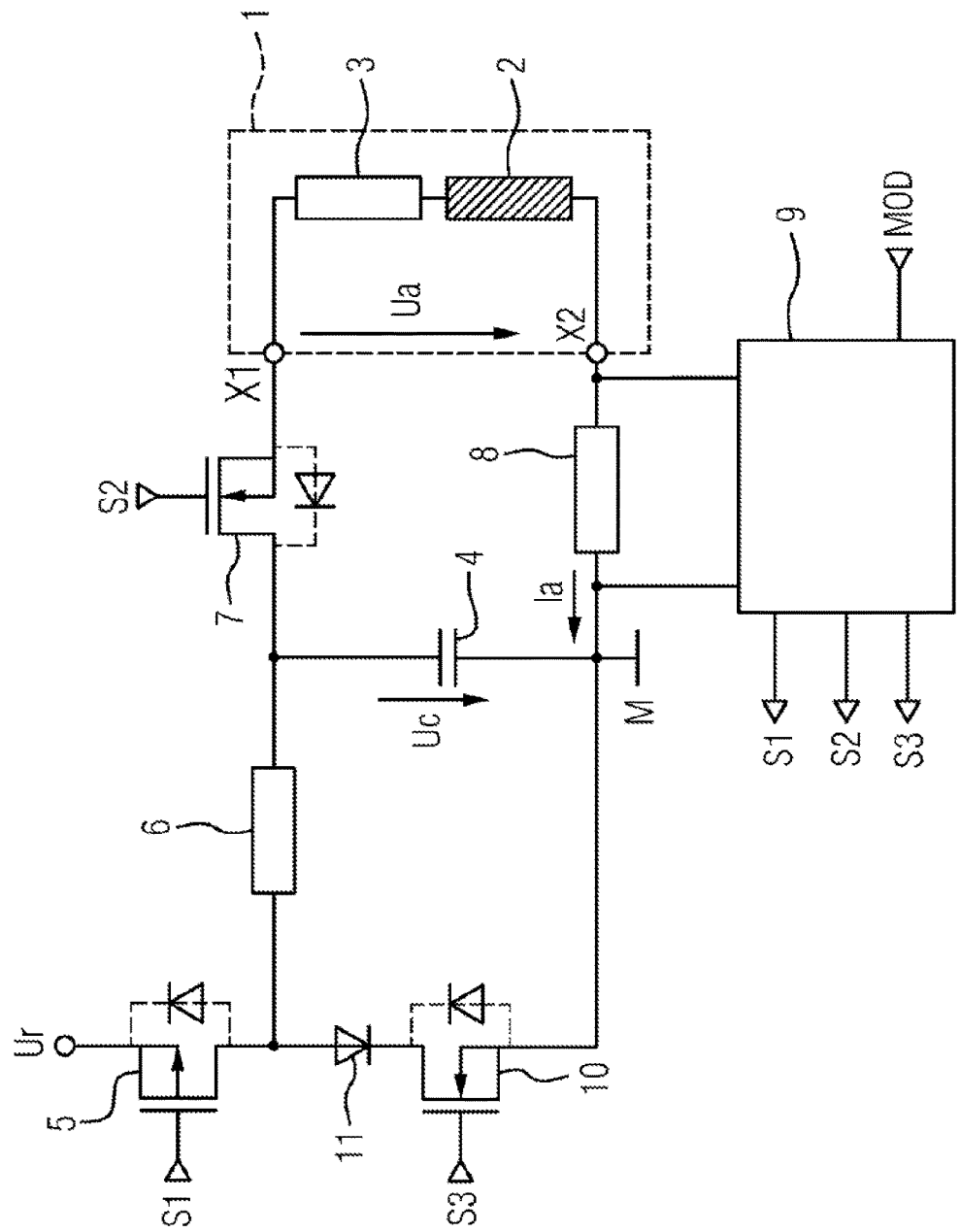
FIG. 1 shows a circuit diagram of a driver circuit for an inductor coil, in an application as an active transmission device for LF signals.

FIG. 1 shows a driver circuit for an inductor coil which, in the present case, is configured as an inductive antenna 1 such as, for example, a ferrite antenna, in an application as an active transmission device. By way of substitution, the inductive antenna 1, as represented in FIG. 1, can be described in the form of a series electric circuit comprised of a purely inductive part 2 and an ohmic part 3. The inductive antenna 1 has a first antenna terminal X1 and a second antenna terminal X2. A capacitor 4 is connected to two input paths for the routing of a reference voltage Ur, which is defined with reference to ground M, and to two output paths for the connection of the inductive antenna 1. A first controllable switch 5 is connected in the upper of the two input paths whereby, alternatively, it can also be connected in the lower of the two input paths.

An ohmic resistor 6, the function of which is current limitation in the input paths, is arranged between the switch 5 and the capacitor 4. In place of the ohmic resistor 6, a current source or another type of current injection or current limitation might also be employed. A second controllable switch 7 is arranged in the upper of the two output paths, and an ohmic resistor 8, which functions as a measuring resistor for the current Ia flowing in the inductive antenna 1, i.e. as a current measuring device, is connected in the lower of the two output paths. Alternatively, the switch 7 and the resistor 8 could be arranged in the same input path, or the respective input paths can be mutually interchanged. Alternatively, for the purposes of current measurement, a tap-off voltage from the capacitor 4 can also be evaluated.

The driver circuit moreover comprises a switch control device 9, which taps a voltage across the resistor 8 which is proportional to the current Ia flowing in the resistor 8, and thus to the current in the antenna 1, and evaluates the latter in order to determine, for example, the zero-crossing of the current Ia. When the second switch 7 is open, by the controlling action of the switch control device 9, the first switch 5 is closed by means of the control signal S1, such that the capacitor 4 is charged to the reference voltage Ur. Thereafter, the first switch 5 is opened, and the second switch 7 is closed by means of the control signal S2, such that the capacitor 4 is discharged via the inductive antenna 1 in an oscillating manner, i.e. by the execution of at least one complete oscillation, whereby the second switch 7 is not opened again until the current Ia flowing in the inductive antenna 1 has completed an entire oscillation period (or a multiple thereof). The switch control device 9 moreover comprises a modulation input for a modulation signal MOD, which is described in greater detail hereinafter.

Optionally, a third controllable switch 10, where applicable in combination with a series-connected diode 11, can be connected in parallel with the capacitor 4, either directly or—as indicated—via the resistor 6, which is controlled by means of a control signal S3 such that the capacitor 4 is short-circuited, i.e. is discharged for the deactivation of the driver circuit.

Figure 2:
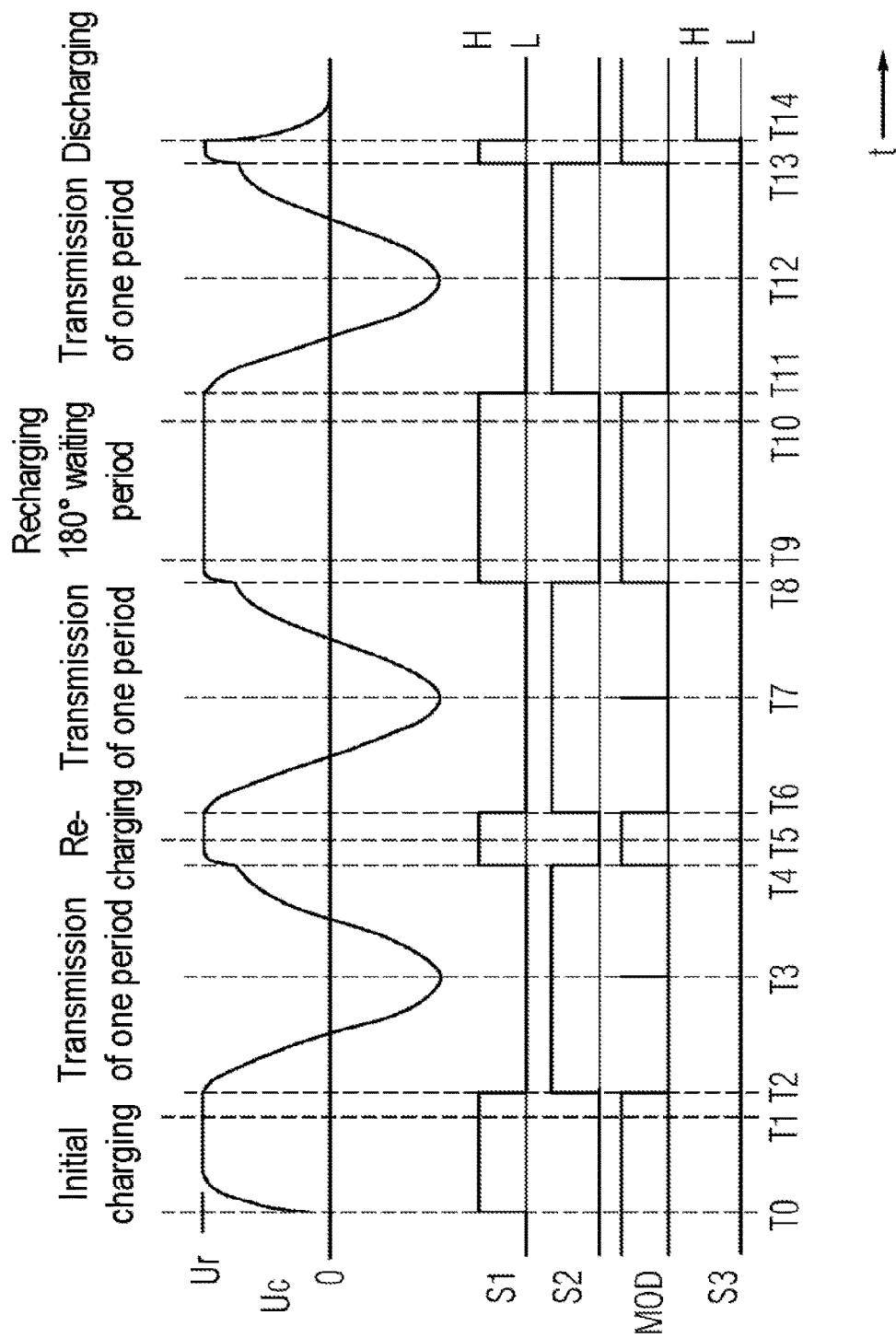
FIG. 2 shows a diagram of the voltage characteristic across the capacitor of the driver circuit, in relation to control signals on the switches and a modulation signal.

The characteristic of the voltage Uc against time t on the capacitor 4, in relation to the control signals S1, S2 and S2, in the event of bi-phase-shift-keying-modulation (BPSK modulation), is represented in FIG. 2. Initially, from a time point T0, the first charging of the capacitor 4 commences, for example from 0 V to the reference voltage Ur and, accordingly, the voltage Uc across the capacitor 4 rises from, for example, 0 V to the reference voltage Ur (in the present case, exponentially). Full charging is achieved at a time point T1. In order to ensure complete charging, even in the event of minor deviations in operating conditions, the switchover between the first switch 5, which is closed for the purposes of charging (with the switch 7 open) and the second switch 7, which is closed for the purposes of oscillating discharge (with the switch 5 open), occurs somewhat later than time point T1, namely at a time point T2.

The oscillating discharge phase of the capacitor 4 thus commences at time point T2. Accordingly, the voltage Uc across the capacitor 4 now decreases again (in the present case, cosinusoidally), first reaches zero and then, in compliance with the behavior of the oscillating circuit comprised of the capacitor 4 and the antenna 1, reaches a maximum negative value with a quality-related amplitude at a time point T3, before rising again to the vicinity of a relative maximum positive value with a quality-related amplitude at a time point T4. The maximum positive value is more or less approximately equal to the reference voltage Ur but, in all cases, is lower than the latter. During the oscillating discharge phase, the antenna 1 transmits an electromagnetic signal. At time point T4, a recharging phase commences, wherein full charging is achieved at a time point T5. The switchover from charging to oscillating discharge then proceeds in turn, on the grounds described above, at a somewhat later time point T6. Thereafter, an oscillating discharge phase proceeds in turn up to a time point T8, including the achievement of the maximum negative value at a time point T7.

A further discharge phase then proceeds, commencing at time point T8, until full charging is achieved at a time point T9. This is followed by a longer waiting time up to a time point T11, which is attributable to a 180° phase displacement associated with BPSK modulation. For comparison, FIG. 2 also includes a time point T10, which indicates the minimum waiting time between the time points T10 and T11. With effect from time point T11, a further oscillating discharge proceeds, up to a time point T13, wherein the maximum negative value is achieved at a time point T12. Thereafter, a further recharging proceeds up to a time point T14 which, however, is interrupted as a result of the deactivation of the driver circuit at time point T14, associated with a final discharging to approximately 0 V (where applicable, the diode voltage across the diode 11), by means of the switch 10.

In accordance with the switching performance of the switches 5, 7 and 10, the control signal S1 during each charging phase (from time points T0 to T1, T4 to T6, T8 to T1, and T13 to T14) assumes the level H, and the control signal S2 initially assumes the level L. In each respective subsequent discharge phase (from time points T2 to T4, T6 to T8, and T11 to T13), the control signal S1 switches to level L, and the control signal S2 switches to level H. The control signal S3 remains at level L up to the final discharging at time point T14, and then switches to level H. In the interests of greater clarity, in the exemplary embodiment represented in FIG. 2, level H essentially represents a closed (conducting) switch, and level L represents an open (non-conducting) switch. However, depending upon the type of an individual switch, or of all the switches actually employed and their specific signal-switch configurations, actual control signals generated may deviate in practice.

The modulation signal MOD, associated with the characteristic of the voltage Uc across the capacitor 4 represented in FIG. 2, is also represented in FIG. 2. The modulation signal MOD assumes level H up to time point T2, then level L up to time point T3, assumes level H at time point T3, then level L up to time point T4, then level H from time point T4 to time point T6, then level L from time point T6 to time point T8, with the exception of level H at time point T7, then level H from time point T8 to time point T11, then level L from time point T11 to time point T13, with the exception of level H at time point T13. Essentially, the modulation signal MOD thus assumes level H during the charging phases of the capacitor 4 and upon the occurrence of the maximum negative value of the voltage Uc on the capacitor 4, and otherwise assumes level L.

Figure 3:
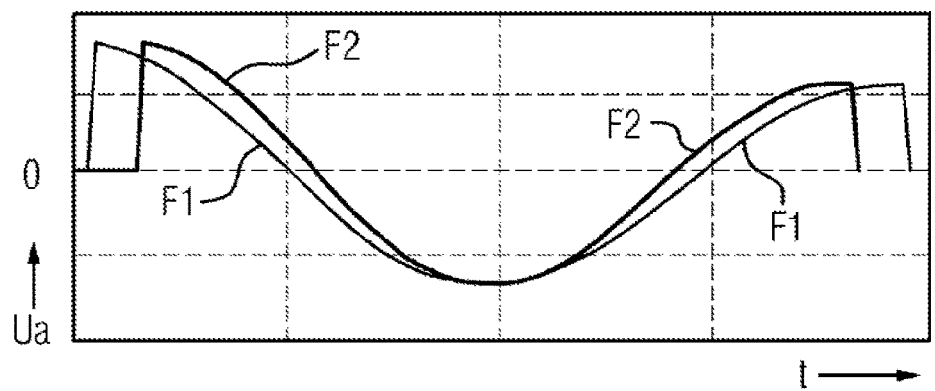
FIG. 3 shows a diagram of the voltage characteristic across the antenna at different resonant frequencies, in relation to the carrier frequency.
Figure 4:
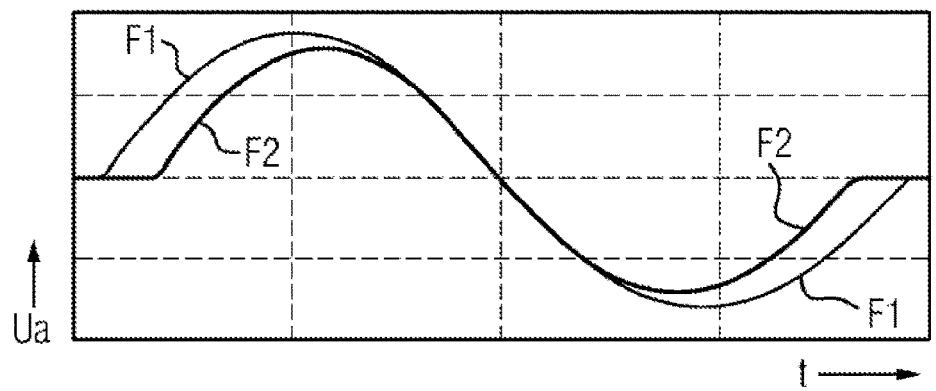
FIG. 4 shows a diagram of the current characteristic in the antenna which corresponds to the voltage characteristic represented in FIG. 3.

FIG. 3 shows the characteristic of the voltage Ua across the antenna 1 plotted against time t for two different resonant frequencies F1 and F2, wherein the resonant frequency F1 exceeds a desired carrier frequency by 5%, and the resonant frequency F2 exceeds the desired carrier frequency by 20%. FIG. 4 shows the respective current characteristic Ia corresponding thereto, plotted against time t, for the two resonant frequencies F1 and F2, represented in an exemplary manner on the resistor 8. As would be anticipated, the phase displacement between the respective voltages and currents is of the order of 90°.

Prior to the switch-in of the antenna 1 to the quasi-resonant operating mode described above, the antenna 1 is de-energized (Ia=0 A). Accordingly, the antenna current Ia does not change, and the antenna terminals X1, X2 are both at the same potential (e.g. the ground potential). Initially, the antenna voltage Ua is thus initially 0 V. If the antenna 1 is then switched to quasi-resonant operation, the potential on the second antenna terminal X2 does not change, whereas the potential on the first antenna terminal X changes such that the antenna voltage Ua becomes equal to the voltage Uc on the capacitor 4 (Ua=Uc). Charge reversals associated with stray capacitances are of no consequence in this regard. As a result of losses during the further operation of the antenna 1, the maximum voltage Ua is reduced such that, shortly before switch-out, the antenna voltage Ua is somewhat lower than the voltage Uc. After the switch-out of quasi-resonant operation, the antenna voltage Ua abruptly falls back down to 0 V, as the antenna current Ia falls to 0 A, and undergoes no further change.

Whereas the potential on the first antenna terminal X1 changes in response to the switch-in and switch-out of quasi-resonant operation, the potential on the second antenna terminal X2 remains constant at all times. In response to both the switch-in and switch-out of quasi-resonant operation, the antenna voltage Ua thus undergoes a voltage jump in each case, as can be seen in FIG. 3. These voltage jumps result in undesirably high radiant emissions on the antenna 1, and on the antenna terminals X1, X2 and the antenna conductors.

Figure 5:
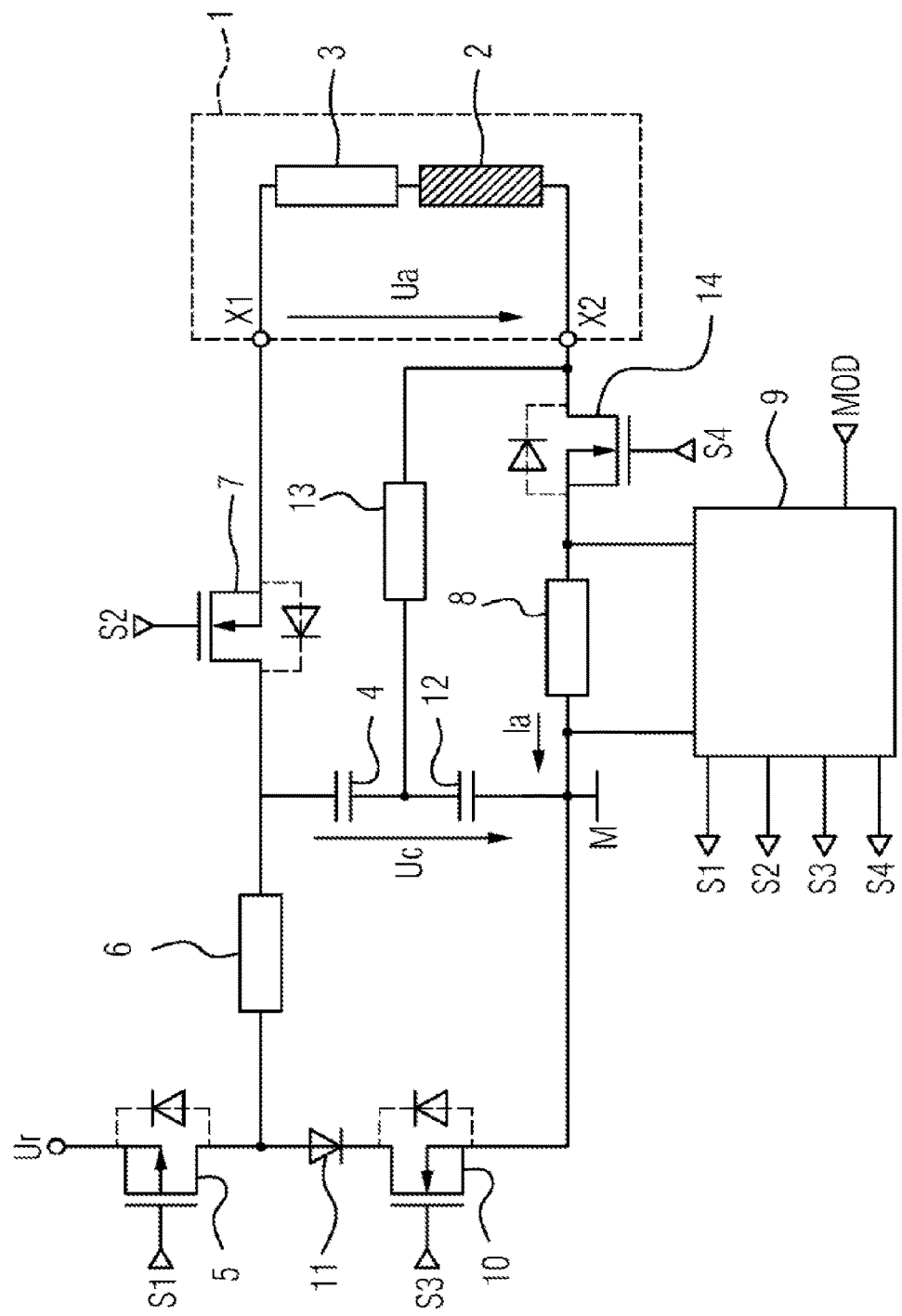
FIG. 5 shows a circuit diagram of a further driver circuit for an inductor coil, in an application as an active transmission device for LF signals.

These radiant emissions can be reduced by means of a driver circuit as represented in FIG. 5. The driver circuit is based upon the driver circuit represented in FIG. 1. However, a second capacitor 12 is connected in series with the first capacitor 4. If the first capacitor 4 and the second capacitor 12 are of equal capacitance, the voltage across each capacitor 4, 12 will be Uc/2.

An ohmic resistor 13 is connected between the second antenna terminal X2 and a common node point of the first and second capacitors 4, 12. Moreover, a fourth controllable switch 14 is connected between the second antenna terminal X2 and the resistor 8. The fourth controllable switch 14 can be open or closed by means of a control signal S4 which is delivered by the switch control device 9. The control signal S4 essentially corresponds to the control signal S2. This means that the fourth controllable switch 14 is essentially opened or closed simultaneously with the second controllable switch 7. However, minor deviations between the two control signals S2, S4 are possible.

As controllable switches 5, 7, 10 and 14 in the driver circuit represented in FIG. 5, field effect transistors are employed, specifically MOS field effect transistors (MOS is the abbreviation for "metal oxide semiconductor"), wherein the controllable switch 5 is a MOS field effect transistor of the p-channel type, whereas the controllable switches 7, 10 and 14 are of the n-channel type. In addition to the MOS field effect transistors indicated (of whatever conductor type), all other types of appropriate controllable switches can be employed, specifically controllable semiconductor switches, naturally in combination with appropriate drivers, bootstrap circuits, charge pumps or similar.

Figure 6:
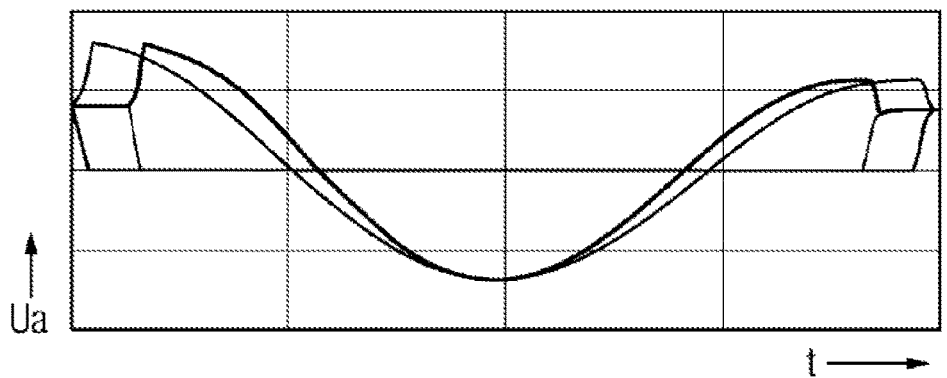
FIG. 6 shows a diagram of the voltage characteristic across the antenna at different resonant frequencies in relation to the carrier frequency, in the application of the driver circuit represented in FIG. 5.

If the second switch 7 and the fourth switch 14 are closed, the quasi-resonant oscillation is as described above with reference to FIG. 2. Thus, prior to the switch-out of the antenna 1, a voltage Ua is present on the antenna 1 which, as a result of losses, is somewhat lower than the voltage Uc across the capacitors 4, 12. As already described above, after switch-out, the antenna 1 returns to a de-energized state (Ia=0A). Given that, after the switch-out of the antenna 1, the second switch 7 and the fourth switch 14 are open, the potential on the first antenna terminal X1 changes from Uc to Uc/2 in response to the resistor 13. Moreover, the potential on the second antenna terminal X2 changes from the ground potential to Uc/2. The characteristic of the resulting antenna voltage Ua plotted against time is represented in FIG. 6.

Figure 7:
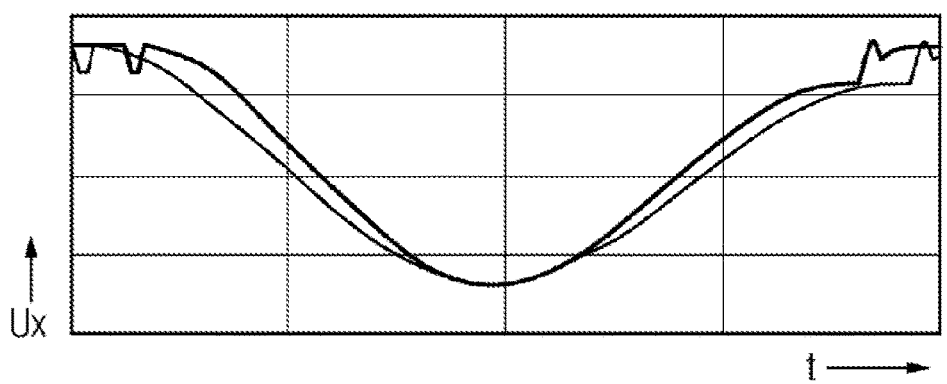
FIG. 7 shows a diagram of the characteristic of the sum of the voltages on the antenna terminals corresponding to the voltage characteristic represented in FIG. 6.

Consequently, the sum Ux of the potentials on the antenna terminals X1, X2 does not change significantly during switching processes on the driver circuit. Minor variations may be caused, for example, by a slight offset in the control signals S2, S4, which is generally unavoidable. The characteristic of the sum Ux of the potentials, plotted against time, is represented in FIG. 7. As the sum of the potentials on the antenna terminals X1, X2 does not change (significantly) during switching processes, radiant emissions caused by switching processes are substantially reduced to zero. However, the circuit complexity of a driver circuit of this type, by means of which radiant emissions can be reduced, is relatively high.

Figure 8:
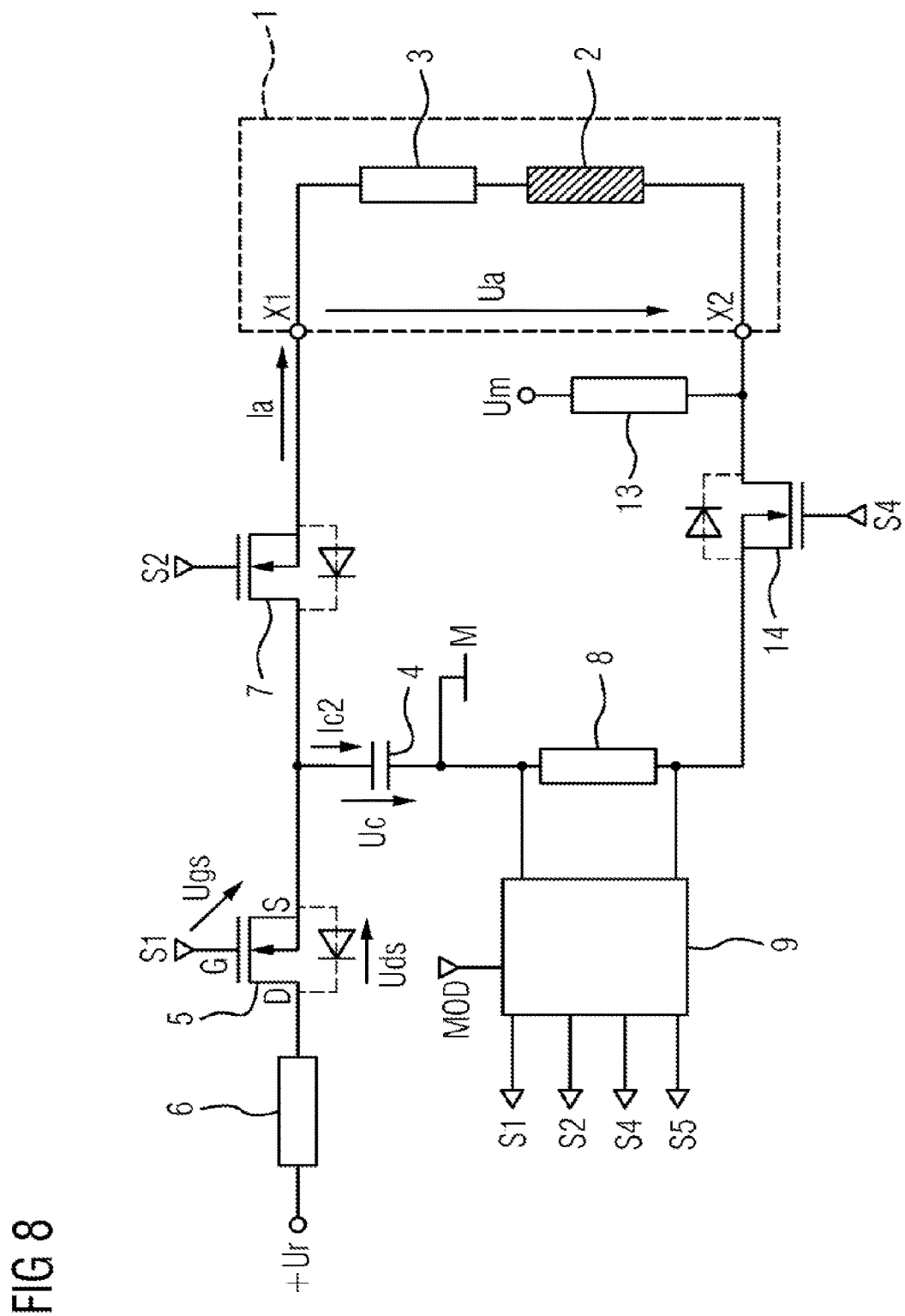
FIG. 8 shows a circuit diagram of an exemplary driver circuit for an inductor coil, in an application as an active transmission device for LF signals, according to one form of embodiment of the invention.

FIG. 8 represents an exemplary form of embodiment of a driver circuit, by means of which circuit complexity can be reduced. The driver circuit is based upon the driver circuit represented in FIG. 5, but the driver circuit in FIG. 8 has only a first capacitor 4. In the driver circuit represented in FIG. 8, however, the ohmic resistor 13 is connected between a terminal for a reference voltage Um and the second antenna terminal X2. The reference voltage Um can, for example, assume a value which corresponds to one half of the capacitor voltage Uc. The resistor 8, which in this driver circuit also serves as a measuring resistor, is connected between the first capacitor 4 and the fourth controllable switch 14. The common node point between the first capacitor 4 and the resistor 8 is bonded to a ground potential.

This arrangement moreover permits a current measurement with reference to ground M.

Again in this exemplary embodiment of the driver circuit, the switch control device 9 taps a current via the resistor 8, and evaluates the latter in order to determine, for example, the zero-crossings of the current Ia in the antenna 1.

In the upper input path, the sequence of the first controllable switch 5 and the ohmic resistor 6 is reversed, in relation to the driver circuit represented in FIG. 5. This means that the switch 5 is now connected between the ohmic resistor 6 and the first capacitor 4. As a result of this arrangement, an overshoot of the gate-source voltage Ugs of the switch 5 in relation to the drain-source voltage Uds of the switch 5 is achieved, as soon as a charging current Ic2 on the first capacitor 4 exceeds a limiting value.

As the node point between the first capacitor 4 and the ohmic resistor 8 is connected to ground M, the first capacitor 4 is charged during the charging phase (with the first controllable switch 5 closed, and the second and fourth controllable switches 7, 14 open). If the first switch 5 is thereafter opened, and the second and fourth switches 7, 14 are closed, the first capacitor 4 is discharged in an oscillating manner, i.e. by the execution of at least one complete oscillation.

Figure 9:
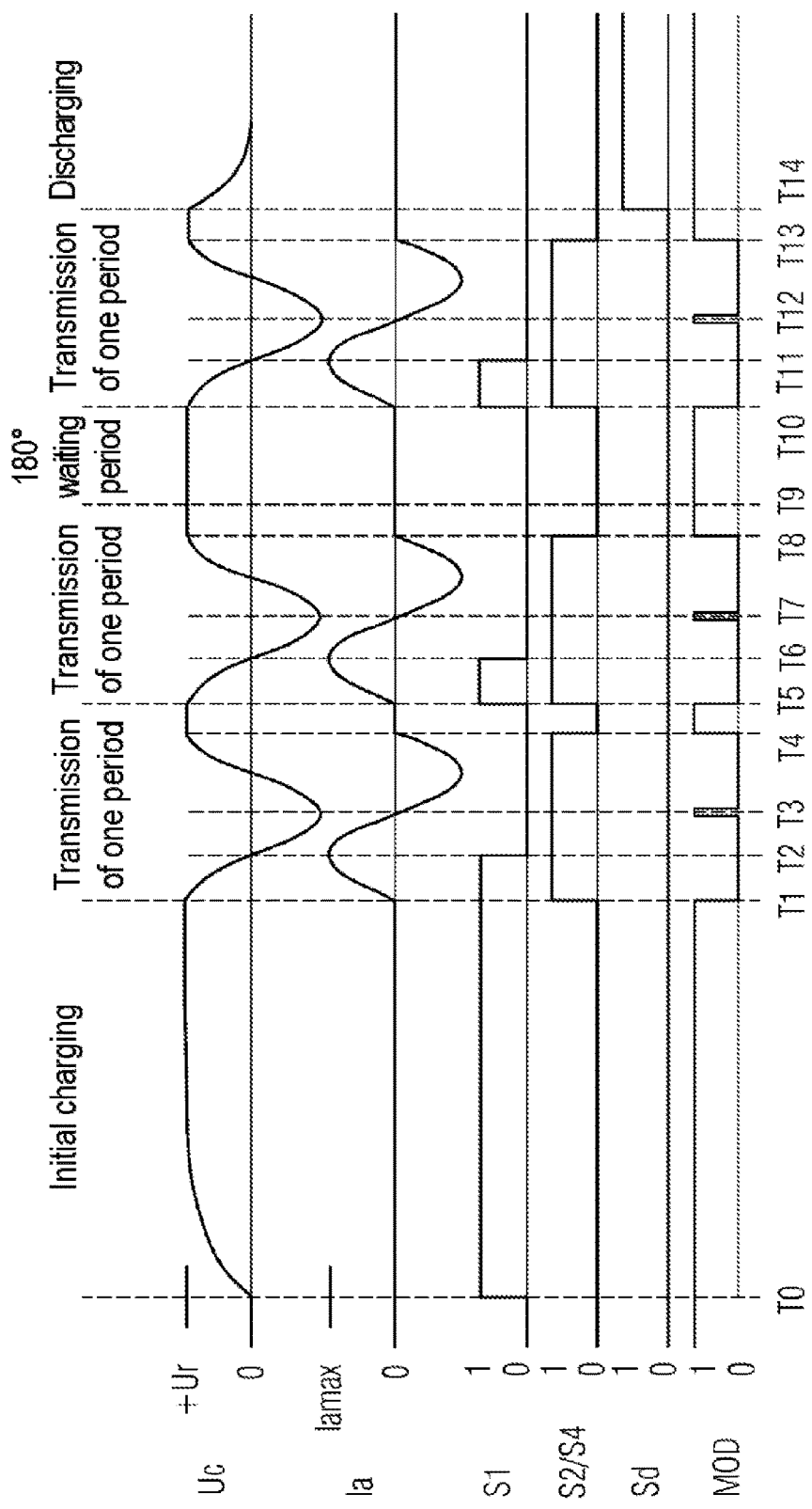
FIG. 9 shows a diagram of the voltage characteristic across the capacitor of the driver circuit and the current characteristic in the antenna, in relation to the control signals on the switches and a modulation signal.

The characteristic of the voltage Uc on the first capacitor 4 and of the current Ia in the antenna 1 plotted against time t, in relation to the control signals S1, S2 and S4 in the event of bi-phase-shift-keying-modulation, is represented in FIG. 9. Initially, at a time point T0, the initial charging of the first capacitor 4 commences from, for example, 0 V to the positive reference voltage +Ur, and the voltage Uc across the first capacitor 4 increases accordingly from, for example, 0 V to the positive reference voltage +Ur (in the present case, exponentially). Full charging is achieved at a time point T1. At this time point, the second and fourth switches 7, 14 are closed.

The oscillating discharge phase of the first capacitor 4 thus commences at time point T1 (transmission phase). Accordingly, the voltage Uc across the first capacitor 4 now decreases again (in the present case, cosinusoidally), and then reaches almost zero at time point T2. The current Ia increases sinusoidally from time point T1 to time point T2, and achieves a maximum value at time point T2. At time point T2, the first switch 5 is then opened. The voltage Uc continues to fall, becomes negative and, in compliance with the behavior of the oscillating circuit comprised of the capacitor 12 and the antenna 1, reaches a maximum negative value with a quality-related amplitude at a time point T3, before rising again to the vicinity of a relative maximum positive value with a quality-related amplitude at a time point T4. The maximum positive value is more or less approximately equal to the reference voltage +Ur but, in all cases, is lower than the latter. During the oscillating discharge phase, the antenna 1 transmits an electromagnetic signal.

At time point T4, the second and fourth switches 7, 14 are open, up to time point T5. At time point T5, the first, second and fourth switches 5, 7, 14 are then closed, wherein the first switch 5 only remains closed for a proportionally short period, up to T6, whereas the second and fourth switches 7, 14 remain closed up to a later time point T8, at which the voltage Uc next achieves its maximum positive value. At time point T8, a waiting phase commences again, during which all the switches 5, 7, 14 are open. The oscillation can thus be displaced, for example by 180°. However, this is only an example.

There then follows a further transmission phase, during which the voltage Uc and the current Ia execute a complete oscillation respectively. From time point T13 to time point T14 a further short waiting period then ensues which, at time point T14, is interrupted by a final discharge to approximately 0 V.

In accordance with the switching performance of the switches 5, 7 and 14, the control signal S1 assumes the level H from time points T0 to T2, T5 to T6, and T10 to T11). The control signals S2 and S4 are initially at level L. Between time points T1 to T4, T5 to T8 and T10 to T13, the control signals S2, S4 switch to level H. In the interests of greater clarity, in the exemplary embodiment represented in FIG. 2, level H essentially represents a closed (conducting) switch, and level L represents an open (non-conducting) switch. However, depending upon the type of an individual switch, or of all the switches actually employed and their specific signal-switch configurations, actual control signals generated may deviate in practice.

The modulation signal MOD, associated with the characteristic of the voltage Uc across the first capacitor 4 represented in FIG. 9, is also represented in FIG. 9. The modulation signal MOD assumes level H up to time point T1, then level L up to time point T3, assumes level H at time point T3, then level L up to time point T4, then level H from time point T4 to time point T5, then level L from time point T5 to time point T8, with the exception of level H at time point T7, then level H from time point T8 to time point T10, then level L from time point T11 to time point T13, with the exception of level H at time point T12. Essentially, the modulation signal MOD thus assumes level H during the charging phases of the first capacitor 4 and upon the occurrence of the maximum negative value of the voltage Uc on the first capacitor 4, and otherwise assumes level L.

Figure 10:
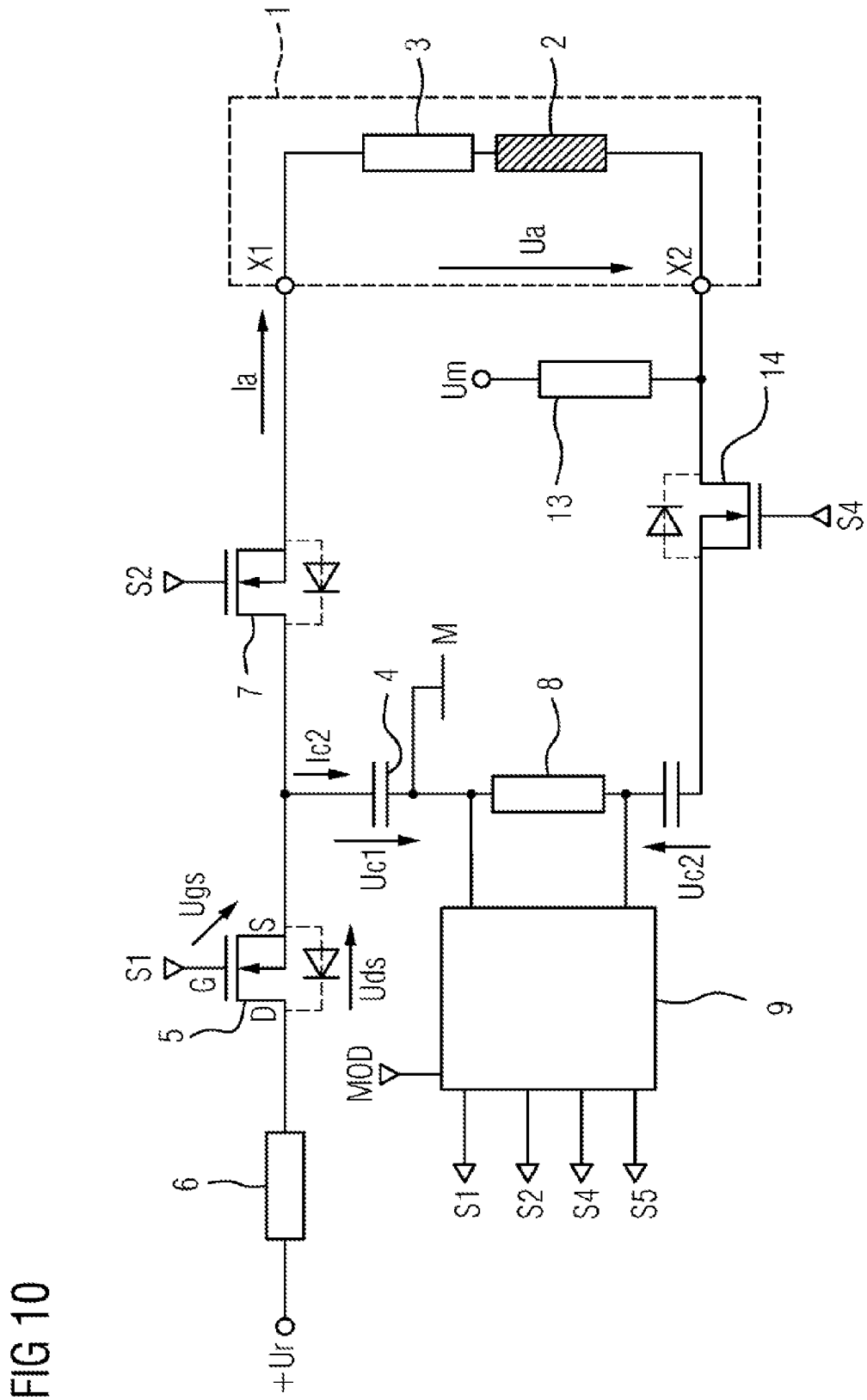
FIG. 10 shows a circuit diagram of a further exemplary driver circuit for an inductor coil, in an application as an active transmission device for LF signals, according to one form of embodiment of the invention.

FIG. 10 represents a further exemplary embodiment of a driver circuit. The driver circuit is based upon the driver circuit represented in FIG. 8. However, the driver circuit in FIG. 10 has a second capacitor 12, which is connected between the ohmic resistor 8 and the fourth switch 14.

As the node point between the first capacitor 4 and the ohmic resistor 8 is bonded to ground M, only the first capacitor 4 is charged during the charging phase (with the first controllable switch 5 closed and the second and fourth controllable switches 7, 14 opened). The second capacitor 12 remains discharged. If the first switch 5 is thereafter opened and the second and fourth switches 7, 14 closed, energy during the quasi-resonant oscillation first switches over, via the antenna inductor coil 2, from the first capacitor 4 to the second capacitor 12 (180° oscillation), and thereafter from the second capacitor 12 back to the first capacitor 4 (360° oscillation).

Figure 14:
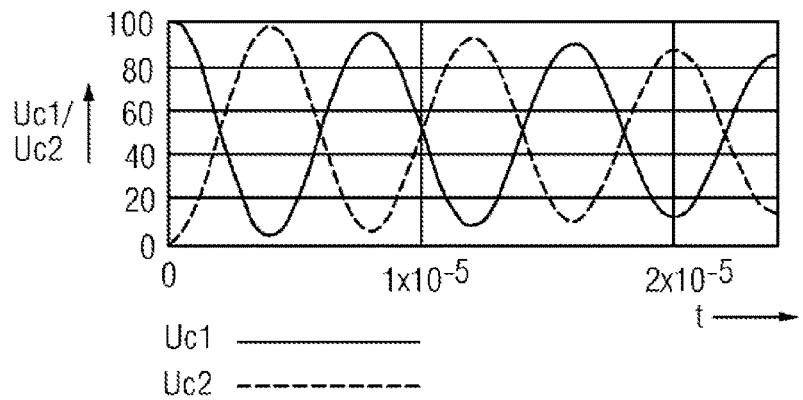
FIG. 14 shows a diagram of the characteristic of voltages across the capacitors in the driver circuit represented in FIG. 10.

The voltage Uc1 across the first capacitor 4 and the voltage Uc2 across the second capacitor 12 are represented diagrammatically in FIG. 14. FIG. 14 thus represents the characteristic of the voltages Uc1, Uc2, in the event that the oscillation is not interrupted by charging phases. In all cases, the voltage Uc2 across the second capacitor 12 achieves its maximum value when the voltage Uc1 across the first capacitor 4 reaches a minimum value, and vice versa.

Figure 11:
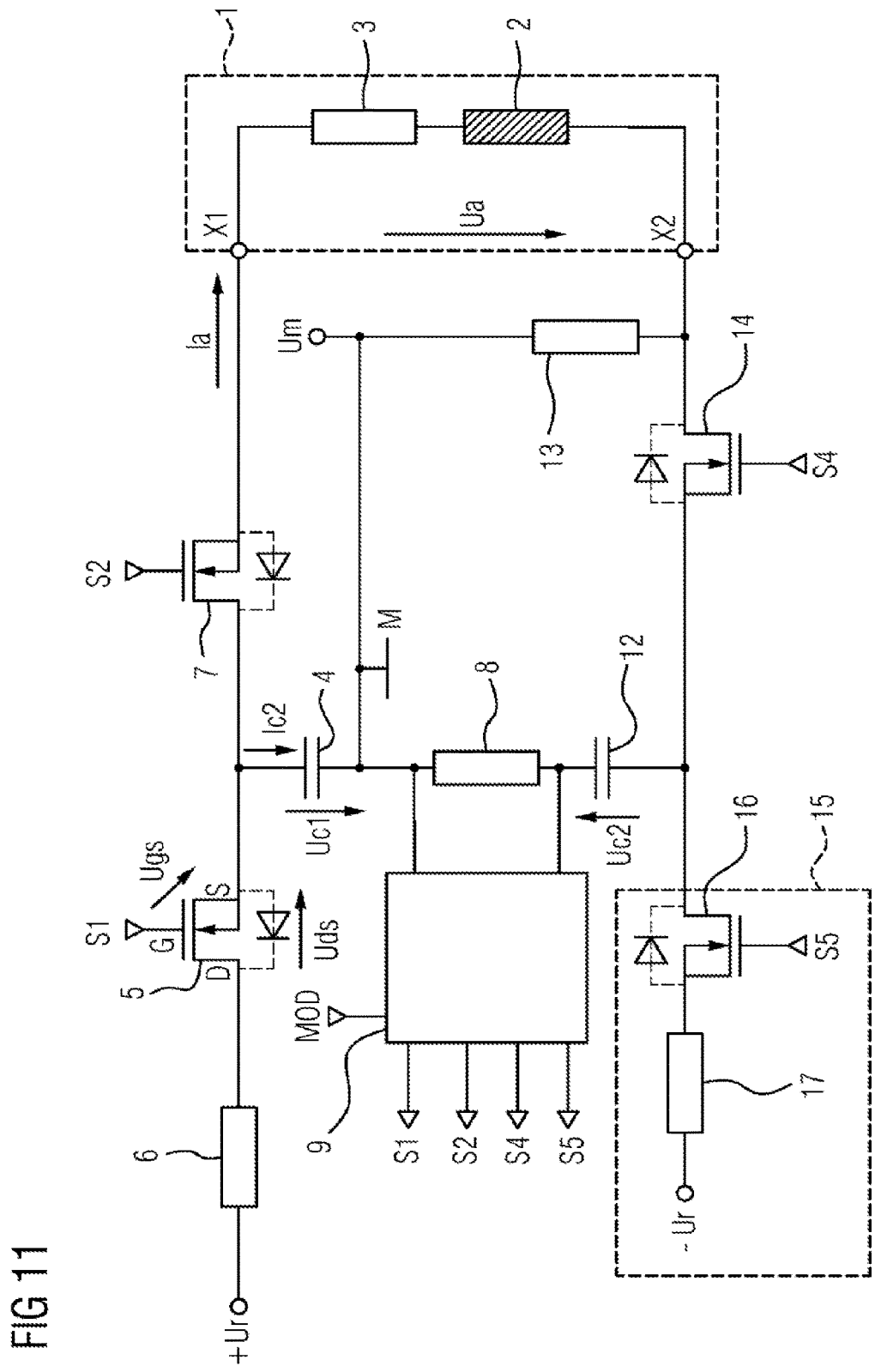
FIG. 11 shows a circuit diagram of a further exemplary driver circuit for an inductor coil, in an application as an active transmission device for LF signals, according to one form of embodiment of the invention.

The driver circuit represented in FIG. 11 is based upon the driver circuit in FIG. 10, but also incorporates an optional charging circuit 15. The driver circuit moreover incorporates a connection between the reference voltage Um and ground M. The charging circuit 15 forms a further input path for the routing of a negative reference voltage −Ur, in relation to ground M. In this arrangement, the upper input path can be configured for the delivery of a positive reference voltage +Ur, in relation to ground. The magnitudes of the positive and negative reference voltages +Ur, −Ur can be equal. The further input path incorporates an ohmic resistor 17 and a fifth controllable switch 16, wherein the fifth switch 16 is connected between the resistor 17 and the second capacitor 12. The fifth switch 16 can be opened or closed by means of a control signal S5 which is delivered by the switch control unit 9. The control signal S5 essentially corresponds to the control signal S1. This means that the fifth switch 16 is essentially opened or closed simultaneously with the first switch 5. However, minor deviations between the two control signals A1, S5 are possible. During the charging phase, the second capacitor 12 is thus charged to a negative volt age −Ur, whereas the first capacitor 4 is charged to a positive voltage +Ur. In this manner, the voltage Ua across the antenna 1 can be doubled, such that the reactive power emitted by the antenna 1 is quadrupled.

In the present driver circuit, the charging of the first capacitor 4 during the charging phase can dictate a specific control of the first switch 5, in order to prevent any damage to the gate oxide of the switch 5, where the latter is configured as a field effect transistor.

Figure 12:
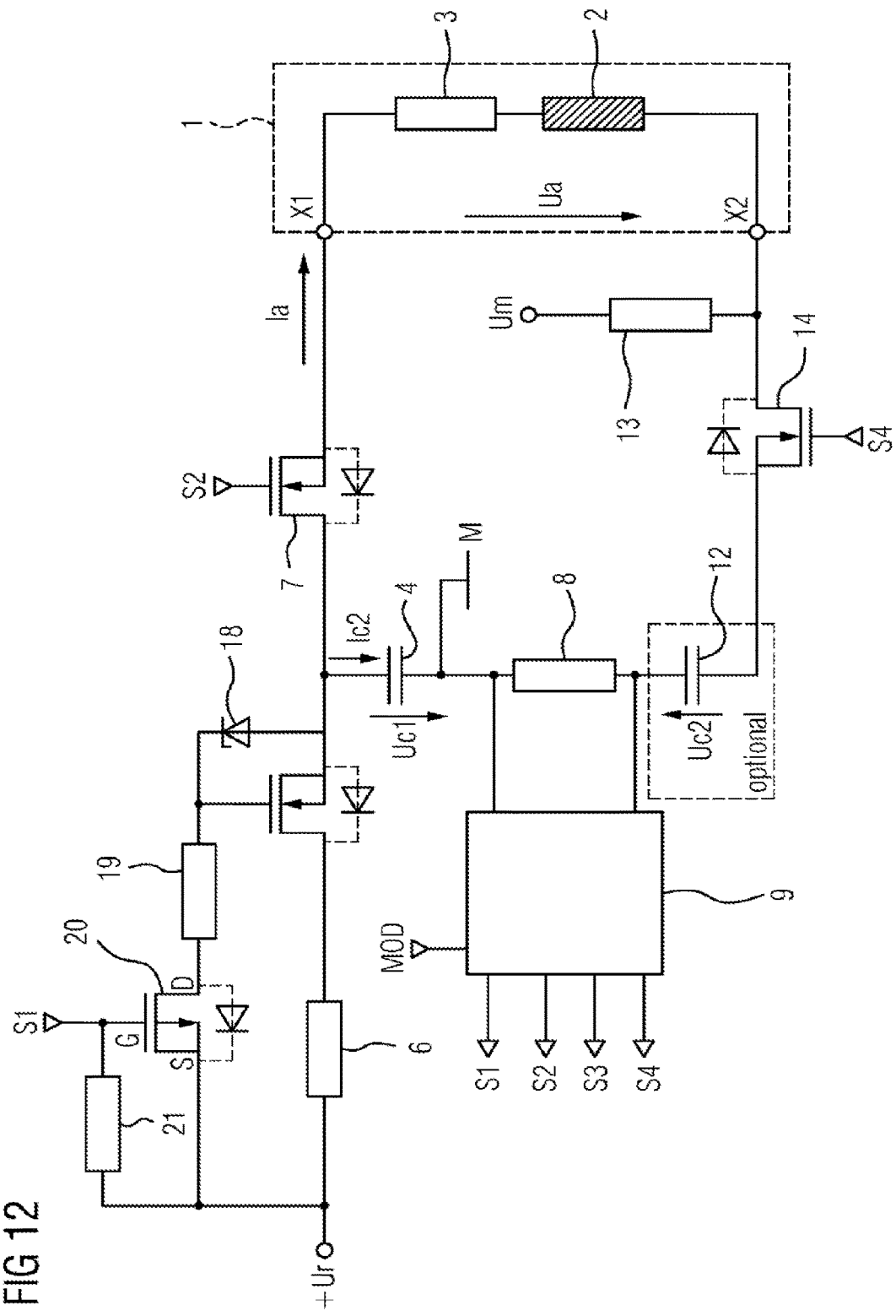
FIG. 12 shows a circuit diagram of a further exemplary driver circuit for an inductor coil, in an application as an active transmission device for LF signals, according to one form of embodiment of the invention.

A driver circuit with a control circuit for the first switch 5 is represented in the circuit diagram shown in FIG. 12. A Zener diode 18 is connected between the gate terminal G and the source terminal S of the switch 5, wherein the anode of the Zener diode 18 is bonded to the source terminal S, and the cathode thereof is bonded to the gate terminal G. In this manner, the gate-source voltage Ugs on the switch 5 can be limited. In place of the Zener diode 18, however, other components can also be employed which are appropriate for the limitation of the gate-source voltage Ugs. A further controllable switch 20 and an ohmic resistor 19 are connected between the gate terminal G of the first switch 5 and the ohmic resistor 6. The control signal S1 is delivered to the gate terminal G of the further switch 20. The gate terminal G of the first switch 5, via the further switch 20 and the resistor 19, is charged to the voltage which is dictated by the voltage limiting circuit arrangement (e.g. the Zener diode 18). The function of the resistor 19 is to limit the current flowing in the Zener diode 18, upon the achievement of the voltage limit.

A further ohmic resistor 21 is connected between the gate terminal G and the source terminal S of the further switch 20. Accordingly, the further switch 20 is blocked, if no control signal S1 is present on its gate terminal G.

Figure 13:
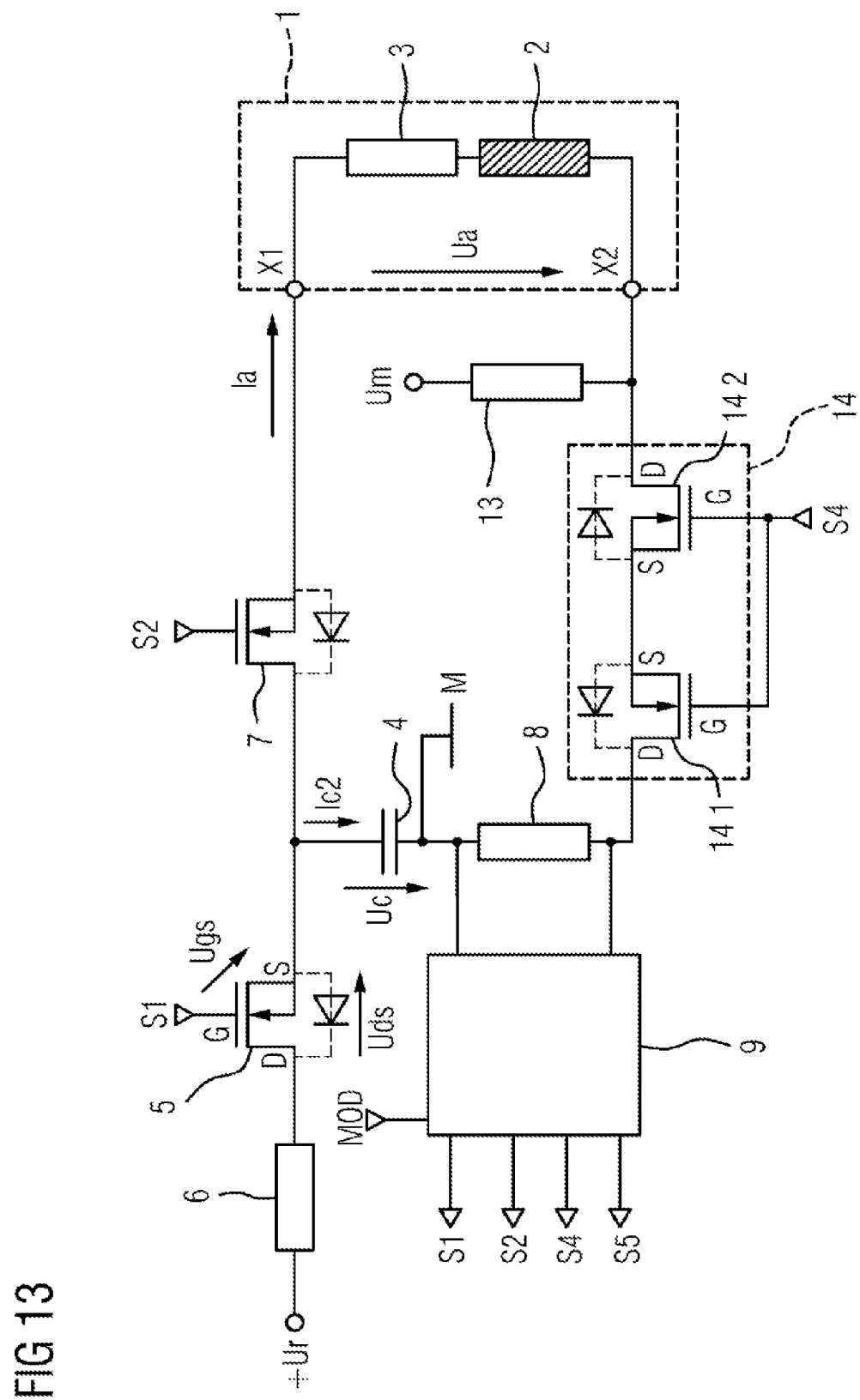
FIG. 13 shows a circuit diagram of a further exemplary driver circuit for an inductor coil, in an application as an active transmission device for LF signals, according to one form of embodiment of the invention.

In one form of embodiment, the second or fourth switches 7, 14, or both, can be configured as "back-to-back" transistors. In the driver circuit represented in FIG. 13, for example, the fourth switch 14 is configured as a back-to-back MOSFET. This means that the switch is comprised of a first MOSFET 141 and a second MOSFET 142, the source terminals S of which are interconnected. The drain terminal D of the first MOSFET 141 is bonded to the resistor 8, and the drain terminal D of the second MOSFET 142 is bonded to the second antenna terminal X2. This arrangement ensures that, in the event of a blocked state on the MOSFETs 711, 712, no conductive connection is present between the two drain terminals D. The MOSFETs 141, 142 each have a parasitic diode between their respective drain and source terminals D, S. In the present arrangement, these diodes are anti-series connected, thus preventing any conductive connection in the deactivated state. A back-to-back arrangement of this type can be provided, for example, if an arrangement comprises more than one antenna 1, which are activated or deactivated by means of a multiplexer.

Figure 15:
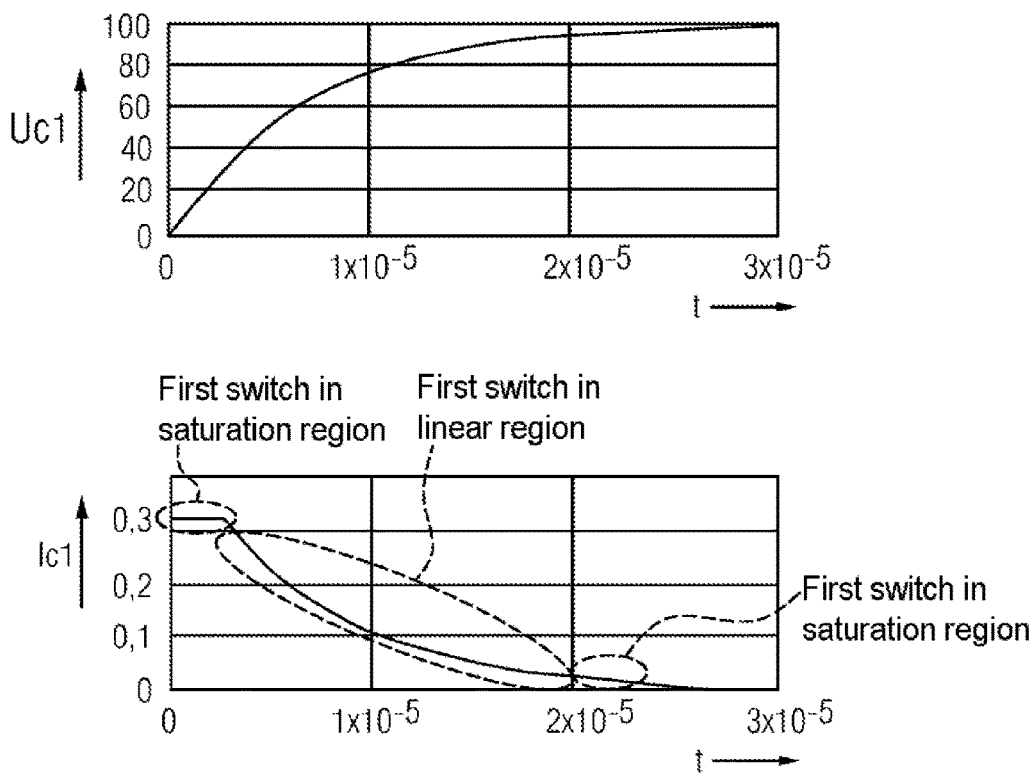
FIG. 15 shows exemplary diagrams of the voltage characteristic across, and the charging current in, the first capacitor.

The diagrams in FIG. 15 show an exemplary representation of the current Ic1 in, and the voltage Uc1 across, the first capacitor 4 during the charging phase. At the start of charging, the first switch 5 is in a saturation region, and thus limits the charging current Ic1 flowing in the first capacitor 4. Upon the transition of the first switch 5 to the linear region, the charging current Ic1 flowing in the first capacitor 4 begins to reduce. Shortly before the maximum voltage across the first capacitor 4 is achieved, the first switch 5 switches back to the saturation region, and ultimately assumes a blocking state in response to a threshold voltage which lies below the (positive) supply voltage +Ur.

In the driver circuit according to the invention, it is advantageously provided that the voltage ranges of the drain and source terminals of the n-channel MOSFETs employed lie between 0 V and 100 V. The voltage ranges are thus subject to an upper limit, and include no negative values. It is therefore possible to employ MOSFETs which have been manufactured using "bulk technology". MOSFETs manufactured using "SOI technology" (SOI=silicon on isolator) could also be employed, although this is not absolutely necessary. MOSFETs manufactured using SOI technology have a number of advantages over MOSFETs manufactured using bulk technology, but are more complex and consequently more expensive to produce.

Charging processes on the capacitor 4 or on the capacitors 4, 12 have no effect upon the antenna potential, and thereby cause no emission of an electrical field (in common mode). The emission of electrical fields generally results in increased EMI (electromagnetic interference). In the present driver circuits, in comparison with known driver circuits, EMI is thus reduced.

In the application of the control circuit for the first switch 5 represented in FIG. 12, there is no requirement for the overshoot of the gate-source voltage Ugs on the first switch 5 in relation to the positive reference voltage +Ur. Accordingly, conversely to known driver circuits, no additional circuitry is required for the generation of such a voltage overshoot. The driver circuit can thus be comprised of a smaller number of components. The positive reference voltage +Ur can thus be selected such that it lies slightly below the permissible voltage for the MOSFET technology employed. This results in a maximum antenna current, and the consequent optimization of range.

In order to achieve the doubling of the voltage Ua across, and the current Ia in the antenna 1, the aforementioned driver circuit can be extended by means of a charging circuit 15 to form a full-bridge circuit. Although additional components are required for this purpose, no modification of the remainder of the circuit arrangement is necessary. This extension can thus be achieved with no great complexity.

LIST OF REFERENCE SYMBOLS 1 inductive antenna
2 inductive element
3 ohmic element
4 first capacitor
5 controllable switch
6 ohmic resistor
7 controllable switch
8 current measuring device
9 switch control device
10 controllable switch
11 diode
12 second capacitor
13 ohmic resistor
14 controllable switch
15 charging circuit
16 controllable switch
17 ohmic resistor
18 Zener diode
19 ohmic resistor
20 controllable switch
21 ohmic resistor
Ur reference voltage
+Ur positive reference voltage
−Ur negative reference voltage
Uc voltage across the capacitors
Uc1 voltage across the first capacitor
Uc2 voltage across the second capacitor
Ua antenna voltage
Ux sum of the potentials on the antenna terminals
Ugs gate-source voltage
Uds drain-source voltage
Ia antenna current
Ic2 charging current in the second capacitor
X1 first antenna terminal
X2 second antenna terminal
S1 control signal
S2 control signal
S3 control signal
S4 control signal
S5 control signal
MOD modulation signal
F1 first resonant frequency F2 second resonant frequency
G gate terminal
D drain terminal
S source terminal

The invention claimed is:

1. A driver circuit for an inductor coil comprising:
a first capacitor,
two input paths configured to route a positive reference voltage to the first capacitor,
two output paths configured to connect the inductor coil to the first capacitor,
a first controllable switch and a first ohmic resistor, connected in series in one of the two input paths, wherein the first controllable switch is connected between the first ohmic resistor and the first capacitor,
a second controllable switch connected in one of the two output paths,
a fourth controllable switch connected in the other of the two output paths,
a second ohmic resistor connected between a second terminal of the inductor coil and a reference potential terminal,
a current measuring device connected between the fourth controllable switch and the first capacitor, and configure to measure a current flowing in the inductor coil, and
a switch control device, connected down-circuit of the current measuring device the switch control device evaluating the current flowing in the inductor coil and configured to, first close the first switch when the second and the fourth switches are open, thereby charging the first capacitor to the positive reference voltage, and thereafter open the first switch and close the second and the fourth switches thereby discharging the first capacitor in an oscillating manner via the inductor coil, wherein the second and the fourth switches are not opened again until the current flowing in the inductor coil has completed an entire oscillation period or a multiple thereof.

2. The driver circuit as claimed in claim 1, further comprising a second capacitor connected between the fourth controllable switch and the current measuring device.

3. The driver circuit as claimed in claim 2, further comprising a third input path configured to route a negative reference voltage to the second capacitor wherein a charging circuit is connected in the third input path.

4. The driver circuit as claimed in claim 3, wherein the charging circuit comprises a third ohmic resistor and a fifth controllable switch, which are mutually serially-connected in the third input path, wherein the fifth controllable switch is arranged between the third ohmic resistor and the second capacitor.

5. The driver circuit as claimed in claim 1, further comprising a limiting device configured to limit a voltage across the first switch.

6. The driver circuit as claimed in claim 5, wherein the limiting device comprises a Zener diode.

7. The driver circuit as claimed in claim 5, wherein the voltage across the first switch is a gate-source voltage.

8. The driver circuit as claimed claim 5, further comprising an fourth ohmic resistor and a sixth controllable switch, the fourth ohmic resistor and the sixth controllable switch connected in series between a control terminal on the first switch and the first ohmic resistor.

9. The driver circuit as claimed in claim 8, further comprising a seventh ohmic resistor connected between a control terminal and a source terminal of the sixth switch.

10. The driver circuit as claimed in claim 1, wherein the switch control device comprises a modulation input for a modulation signal, and is configured to control switching cycles of the first switch, the second switch and the fourth switch, in accordance with the modulation signal.

11. The driver circuit as claimed in claim 1, wherein the switch control device is configured to execute a phase-shift-keying-modulation, an amplitude-shift-keying-modulation or a frequency-shift-keying-modulation.

12. The driver circuit as claimed in claim 1, wherein the current measuring device is configured as an ohmic resistor.

13. An active transmission device comprising:
an inductor coil,
a first capacitor,
two input paths configured to route a positive reference voltage to the first capacitor,
two output paths configured to connect the inductor coil to the first capacitor,
a first controllable switch and a first ohmic resistor, connected in series in one of the two input paths, wherein the first controllable switch is connected between the first ohmic resistor and the first capacitor,
a second controllable switch connected in one of the two output paths,
a fourth controllable switch connected in the other of the two output paths,
an second ohmic resistor connected between a second terminal of the inductor coil and a reference potential terminal,
a current measuring device connected between the fourth controllable switch and the first capacitor, and configured to measure a current flowing in the inductor coil, and a switch control device, connected down-circuit of the current measuring device the switch control device evaluating the current flowing in the inductor coil and is configured to, firstly close the first switch when the second and the fourth switches are open, thereby charging the first capacitor to the positive reference voltage, and thereafter open the first switch and close the second and the fourth switches, thereby discharging the first capacitor in an oscillating manner via the inductor coil, wherein the second and the fourth switches are not opened again until the current flowing in the inductor coil has completed an entire oscillation period or a multiple thereof.

* * * * *